US007192691B2

(12) United States Patent
Hirabayashi

(10) Patent No.: US 7,192,691 B2
(45) Date of Patent: Mar. 20, 2007

(54) METHOD OF MANUFACTURING LIGHT SENSITIVE PLANOGRAPHIC PRINTING PLATES AND METHOD OF USING THE SAME

(75) Inventor: Kazuhiko Hirabayashi, Kanagawa (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/201,813

(22) Filed: Aug. 11, 2005

(65) Prior Publication Data

US 2006/0040211 A1 Feb. 23, 2006

(30) Foreign Application Priority Data

Aug. 18, 2004 (JP) ............................. 2004-238062

(51) Int. Cl.
*G03F 7/20* (2006.01)
*G03F 7/26* (2006.01)

(52) U.S. Cl. ...................... 430/302; 430/309; 430/434; 430/494; 430/944; 430/945

(58) Field of Classification Search ............. 430/270.1, 430/302, 309, 434, 494, 944, 945
See application file for complete search history.

(56) References Cited

U.S. PATENT DOCUMENTS 6,468,711 B1 * 10/2002 Sorori et al. ............. 430/270.1
2003/0124455 A1 7/2003 Nakamura et al.
2004/0157153 A1 * 8/2004 Takamuki ................ 430/270.1

FOREIGN PATENT DOCUMENTS

EP 1 223 196 A2 7/2002
JP 2001-194800 7/2001

* cited by examiner

*Primary Examiner*—Barbara L. Gilliam
(74) *Attorney, Agent, or Firm*—Lucas & Mercanti, LLP

(57) ABSTRACT

A method of manufacturing a light sensitive planographic printing plate which has an image forming layer containing (A) a coloring material having an absorption in a wavelength range of 700 nm through 1200 nm and (B) a radical generator on a support and is exposed by a laser beam with a light emission wavelength in a wavelength range of 700 nm through 1200 nm, the method comprising: at least coating process, dry process, cutting process, and inspection/sorting process, wherein either of the coating process, the dry process, the cutting process, or the inspection/sorting process is carried out under light of a light source comprising a light-emitting diode with an emission wavelength maximum in a range of 400 nm through 500 nm and a fluorescent phosphor to emit an yellow light by absorbing a light emission of the light-emitting diode.

13 Claims, 1 Drawing Sheet

METHOD OF MANUFACTURING LIGHT SENSITIVE PLANOGRAPHIC PRINTING PLATES AND METHOD OF USING THE SAME

This application is based on Japanese Patent Application No. 2004-238062 filed on Aug. 18, 2004, in Japanese Patent Office, the entire content of which is hereby incorporated by reference.

TECHNICAL FIELD

The present invention relates to a method of manufacturing a light sensitive planographic printing plate suitable for use in computer to plate systems (referred to hereinafter as CTP) using laser and a method of using the same, more specifically the invention relates to a method of manufacturing a light sensitive planographic printing plate which is particularly exposed by infrared laser and a method of using the same.

BACKGROUND ART

Recently, in the manufacturing technology of printing plates for offset printing, a number of CTP systems that directly applies image exposure onto a plate material of a planographic printing plate by a laser light source based on digital data of an image to record the image has been developed and applied to practical application. Particularly, in accordance with the higher output capability in the solid laser and semiconductor laser having emission wavelengths in the near-infrared region, the CTP system for recording by near-infrared light, namely so called thermal CTP system has been widely spread.

As a plate material of a planographic printing plate used for the thermal CTP (the plate material for CTP), U.S. Pat. No. 5,340,699 describes an example of including infrared absorbent, acid forming agent, resole resin, novolac resin as the components of an image recording layer. In this plate material for CTP, acid is generated for an image by the mutual action of the infrared absorbent and the acid forming agent in the laser exposure section, and the acid bridge reaction of the resole resin is developed by heat treatment after exposure. An unexposed portion has high solubility toward the alkali aqueous solution and can be dissolved and removed by alkali processing, while an exposed portion in which the cross linkage has been developed loses solubility toward the alkali aqueous solution and the image recording layer remains imagewisely, thereby an image is formed therein.

Further, in a negative type of image forming material comprising providing the image recording layer including the infrared absorbent, radical generator, radical polysynthetic compound, and binder polymer, there is known an example of carrying out image exposure by infrared laser followed by heating the material at a temperature in the range of 60 through 120° C. for 1 through 20 seconds, namely carrying out the heat treatment after exposure, wherein, for example, triazine compound including trihalomethyl group may be used as the radical generator (see Patent Document 1).

On the contrarily, higher sensitivity is required from the standpoint of effectiveness of plate-making work for manufacturing printing plates, and Publication of a Translation of an International Application No. 2002-537419 discloses a technology in which higher sensitivity is achieved by causing the image recording layer to contain polycarboxylic acid having a specific formation without shortening the material storage time.

Further, a technology is known that raises effectiveness of polymerization and increases the run length capability without carrying out the heart treatment by using a specific cyanine dye as the infrared absorbent (see Patent Documents 2 and 3).

However, when these printing plate materials are manufactured and the plate making work is carried out, the work need to be carried out under a safe light, so that the workability is low, and when this work is carried out under a fluorescent white light (see Patent Document 4), there have been problems in that the dot reproduction is sometimes insufficient, the dot quality of printed matters is sometimes insufficient, and stain recovery capability is sometimes poor.

[Patent Document 1] Japanese Patent Publication Laid-Open No. 2001-175006

[Patent Document 2] Japanese Patent Publication Laid-Open No. 2002-278057

[Patent Document 3] Japanese Patent Publication Laid-Open No. 2003-5363

[Patent Document 4] Japanese Patent Publication Laid-Open No. 2001-194800

DISCLOSURE OF THE INVENTION

An object of the present invention is to provide a method of manufacturing light sensitive planographic printing plates for providing printing plates having high workability with excellent dot reproduction and stain recovery capability as well as printed matters having excellent dot quality, and a method of using the same.

The above object of the present invention will be achieved by the following means.

(Item 1) A method of manufacturing a light sensitive planographic printing plate which has an image forming layer containing (A) a coloring material having an absorption in the wavelength range of 7.00 nm through 1200 nm on a support and (B) a radical generator and is exposed by a laser beam with a light emission wavelength in the wavelength range of 700 nm through 1200 nm, the method having at least coating process, dry process, cutting process, and inspection/sorting process, wherein either of the coating process, the dry process, the cutting process, or the inspection/sorting process is carried out under a light of a light source having a light-emitting diode with an emission wavelength maximum in the range of 400 nm through 500 nm and a fluorescent phosphor to emit an yellow light by absorbing a light emission of the light-emitting diode.

(Item 2) The method of manufacture light sensitive planographic printing plates according to Item 1, wherein said (B) radical generator is a polyhalogen compound.

(Item 3) A method of using light sensitive planographic printing plates which has an image forming layer containing (A) a coloring material having an absorption in the wavelength range of 700 nm through 1200 nm on a support and (B) a radical generator and is exposed by a laser beam with a light emission wavelength in the wavelength range of 700 nm through 1200 nm, the method having at least exposure process, developing process, and printing process, wherein either of the exposure process, the developing process or the printing process is carried out under a light of a light source having a light-emitting diode with an emission wavelength maximum in the range of 400 nm through 500 nm and a fluorescent phosphor to emit yellow light by absorbing a light emission of the light-emitting diode.

(Item 4) The method of using light sensitive planographic printing plates according to Item 3, wherein said (B) radical generator is a polyhalogen compound.

(Item 5) The method of using light sensitive planographic printing plates, wherein the light sensitive planographic printing plates manufactured by the method of manufacturing light sensitive planographic printing plates according to Item 1 or Item 2 is used by the method of using light sensitive planographic printing plates according to Item 3 or Item 4.

The configuration of the present invention may provide a method of manufacturing light sensitive planographic printing plates which provides printing plates having high workability and excellent run length and stain recovery capabilities as well as printed matters having excellent dot quality and the method of using the same.

DETAILED DESCRIPTION OF THE PREFERRED EMBODIMENT

Figure 1:
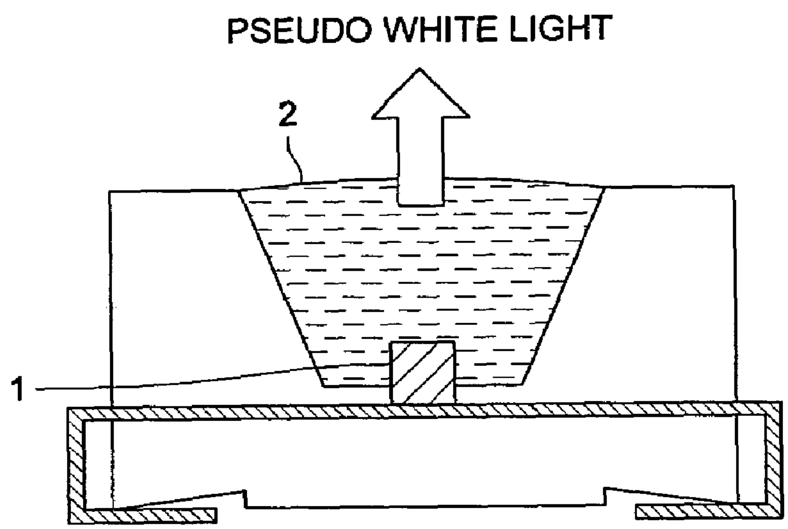
FIG. 1 shows an illustration of a light source of the present invention.
Figure 2:
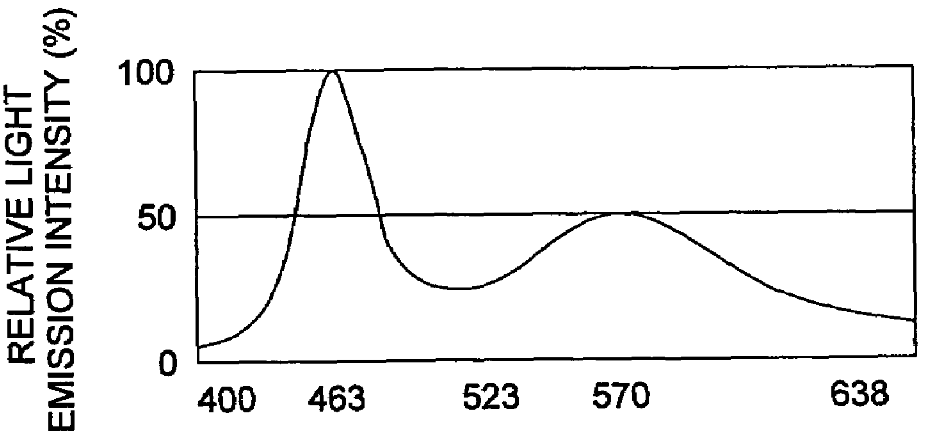
FIG. 2 is a diagram sowing an intensity of light with a wavelength.

The present invention is characterized in that a method of manufacturing light sensitive planographic printing plates which has an image forming layer containing (A) a coloring material having an absorption in the wavelength range of 700 nm through 1200 nm on a support and (B) a radical generator and is exposed by a laser beam with a light emission wavelength in the wavelength range of 700 nm through 1200 nm, the method having at least coating process, dry process, cutting process, and inspection/sorting process, wherein either of the coating process, the dry process, the cutting process, or the inspection/sorting process is carried out under a light of a light source having a light-emitting diode with an emission wavelength maximum in the range of 400 nm through 500 nm and a fluorescent phosphor to emit an yellow light by absorbing a light emission of the light-emitting diode.

Further, the present invention is characterized in that a method of using light sensitive planographic printing plates which has an image forming layer containing (A) a coloring material having an absorption in the wavelength range of the 700 nm through 1200 nm on a support and (B) a radical generator and is exposed by a laser beam with a light emission wavelength in the wavelength range of 700 nm through 1200 nm, the method having at least exposure process, developing process, and printing process, wherein either of the exposure process, the developing process or the printing process is carried out under a light of a light source having a light-emitting diode with an emission wavelength maximum in the range of 400 nm through 500 nm and a fluorescent phosphor to emit an yellow light by absorbing a light emission of the light-emitting diode.

The process flow of manufacturing light sensitive planographic printing plates is started with a process of making a support for a printing plate, and a problem of the present invention is involved in improvement of the work environment where photosensitive materials are handled, relating to the process of coating a photosensitive composition material onto the support and later processes.

Of the processes of manufacturing light sensitive planographic printing plates, the coating process and later are such processes as the coating process, dry process, cutting process, and inspection/sorting process.

Depending on the printing plates, mat making process, aging process, packaging process and the like may be added in addition to the above processes.

Further, the processes of using printing plates are those such as the exposure process, developing process, and printing process.

It is to be noted that in the present invention, each of the coating process, dry process, cutting process, inspection/sorting process, packing process, exposure process, developing process, and the printing process should generally include those recognized as a series of work of the process, like the state where the work is prepared or waiting so as to enter the process as the previous step, and after the process is finished, the state where the work is temporarily retained within the process until moving to the next process, that is meant so to say the process and the workspace around the process, rather than just only the process itself.

Taking the dry process to describe the above, the dry process itself is generally carried out within a dryer. A band-like support for the image forming layer coated with a photosensitive composition is fed between from the coater to the dryer by a roller or the like before entering the dryer.

As the inside of the dryer is generally a dark room having no light, and in this case, the problem that the coated image forming layer is exposed by a safety light does not occur by nature.

On the contrarily, although the dryer itself may be automatically operated, in the case where a worker confirms or operates instruments involved in the dryer in order to confirm or adjust the operation condition, when the workspace around the dry process is under the light of the light resource which is used in the present invention, particularly in the point of color recognition, the workability is higher as compared to the red color and the like, and printing plates having excellent printing capability as described below may be obtained.

The method of manufacturing light sensitive planographic printing plates of the present invention is characterized in that of the coating process, dry process, cutting process, and inspection/sorting process, at least one process is carried out under the light of the light source having a light-emitting diode with an emission wavelength maximum in the range of 400 nm through 500 nm and a fluorescent phosphor to emit an yellow light by absorbing a light emission of the light-emitting diode, however, it is the most preferable that all of the processes are carried out under the light of the light source as described above.

The emission wavelength of the light source used in the manufacturing method and using method of the present invention as described above exists in an entire visible range.

In the manufacturing of light sensitive planographic printing plates or use of light sensitive planographic printing plates under the light source according to the present invention, the lighting is preferably in the range of 101x through 50001x in general, more preferably in the range of 301× through 10001×.

In the manufacturing method and using method of the present invention, the light source is preferably placed at a distance of about 0.5 m through 10 m from the light sensitive planographic printing plate for work efficiency.

Particularly when the plate inspection work is visually carried out, the work is especially facilitated under this light source as compared to under the white light.

The light source according to the present invention, which has the light-emitting diode (LED) with an emission wavelength maximum in the range of 400 nm through 500 nm and the fluorescent phosphor to emit an yellow light by absorbing the light emission of the light-emitting diode may be provided, for example, using a violet-blue LED of 405 nm, by combining a phosphor which yields yellow fluorescent against the light emission of the LED to form as one chip.

FIG. 1 shows an example of a light made in one chip. In FIG. 1, 1 is a LED to emit a violet-blue light having an emission wavelength maximum in the range of 400 nm through 500 nm, an 2 is a fluorescent phosphor member including a light transmissible member (glass member) to transmit a light flux emitted from the LED 1 and a phosphor coated the inner surface of the light transmissible member. This light source emits a pseudo white light by a violet-blue light emitted from the LED 1 and an yellow light emitted from the fluorescent phosphor member 2.

The LED with a light wavelength maximum in the range of 400 nm through 500 nm may include zinc selenide, nitrogen gallium and the like.

As the fluorescent phosphor to emit an yellow light, there may be used yellow fluorescent phosphors such as YAF:Ce, sialon fluorescent phosphor, or phosphors using together red fluorescent phosphors and green fluorescent phosphors as listed below.

The red fluorescent phosphors may include $Y_2O_2S$:Eu, $Y_2O_3$:Eu, (Y, Gd) $BO_3$:Eu, and the green fluorescent phosphors may include ZnS:Cu, Al, $LaPO_4$:Ce, Tb, $Zn_2SiO_4$:Mn, $Gd_2O_2S$:Tb.

Next, a light sensitive planographic printing plate used for a production method and a using method of the present invention is explained.

An image forming layer according to the present invention comprises (A) a coloring material having an absorption in a range of wavelength of 700 nm to 1200 nm and (B) a radical generator and can take any one of a negative type image forming layer and a positive type image forming layer.

((A) Coloring Material which has Absorption in a Range of Wavelength of 700 nm to 1300 nm)

(A) Coloring material (may be abbreviated as (A) hereinafter) which has absorption in a range of wavelength of 700 nm to 1300 nm according to the present invention is a compound which has light absorption in a range of wavelength of 700 nm to 1300 nm and generates heat by this absorption.

As the coloring material according to the present invention which has absorption in a range of wavelength of 700 nm to 1300 nm, although there is no limitation in particular, an infrared absorbing agent, a light-to-heat converting agent, near-infrared dye, and a pigment disclosed in U.S. Pat. No. 5,340,699 and Japanese Patent O.P.I. Publication No. 2001-175006, PCT O.P.I. Publication No. 2002-537419, Japanese Patent O.P.I. Publication No. 2001-341519, Japanese Patent O.P.I. Publication No. 2003-76010, Japanese Patent O.P.I. Publication Nos. 2002-278057, 2003-5363, 2001-125260, 2002-23360, 2002-40638, 2002-62642, and 2002-2787057 may be employed.

Preferably, cyanine dyes, squalirium dyes, oxonol dyes, pyrylium dyes, thiopyrylium dyes, polymethine dyes, oil soluble phthalocyanine dyes, triarylamine dyes, thiazolium dyes, oxazolium dyes, polyaniline dyes, polypyrrole dyes and polythiophene dyes can be used.

Besides the above, pigments such as carbon black, titanium black, iron oxide powder, and colloidal silver can be preferably used. Cyanine dyes as dyes, and carbon black as pigments are especially preferred, in view of extinction coefficient, light-to-heat conversion efficiency and cost.

As a desirable example of the above-mentioned cyanine dye, one listed in the paragraph reference numbers of [0017]–[0019] of Japanese Patent O.P.I. Publication No. 2001-133969, the paragraph reference numbers of [0012]–[0038] of Japanese Patent O.P.I. Publication No. 2002-23360, and the paragraph reference numbers of [0012]–[0023] of Japanese Patent O.P.I. Publication No. 2002-40638.

The added amount of the coloring material in the image formation layer having an absorption in a range of wavelength of 700 nm to 1300 nm is different due to the light absorption coefficient of the coloring material, but is preferably an amount giving a reflection density of from 0.3 to 3.0.

More preferably, it is an amount giving a reflection density of from 0.5 to 2.0. For example, in order to obtain the above reflection density, the content of the cyanine dye in the image formation layer is 10 to 100 $mg/m^2$.

((B) Radical Generator)

A radical generator (B) (it may be written as (B) below) may generate radical with the heat which (A) absorbs a exposure light.

With heat generated by (A) absorbing exposure light, the radical generator (B) mainly functions as an acid in a positive type case so that it raises the solubility of the exposed parts of the image forming layer over the developer solution and acts so as to make it possible to remove the exposed parts of the image forming layer from a base support, and functions as, for example, starting or promoting polymerization in a negative type case so that it hardens the exposed parts of the image forming layer and acts so as to make the exposed parts of the image forming layer not to be removed from the base support.

As the radical generator (B), although the polyhalogenated compound, iodonium salts, sulfonium salts, etc. are may be listed, especially when the polyhalogenated compound is included, the effect of the present invention becomes larger.

As a thermal image forming layer according to the present invention, when a positive type thermal image forming layer containing (A) and the polyhalogenated compound or a negative type thermal image forming layer containing (A), the polyhalogenated compound and a polymerization initiator is employed, especially the effect of the present invention becomes greater desirably.

For example, preferably, an image forming layer containing a material decomposable by an acid may be used as as a positive type image forming layer, or an image forming layer containing a polymerization composition may be used as as a neagative type image forming layer.

As the positive type image forming layer containing the material decomposable by an acid, for exapmle, an image forming layer disclosed in TOKKAIHEI No. 9-171254 and including a photolytically acid generating compound to generate an acid by being exposed with laser exposure, an acid decomposable compount which is decomposed by the generaed acid and increases solubility to a developer solution and an infrared absorbent may be listed.

In this case, a photolytically acid generating compound corresponds to a radical generator (B) according to the present invention.

As the photolytically acid generating compound there are various conventional compounds and mixtures.

For example, a salt of diazonium, phosphonium, sulfonium or iodonium ion with $BF_4^-$, $PF_6^-$, $SbF_6^-$ $SiF_6^{2-}$ or $ClO_4^-$, an organic halogen containing compound, o-quinonediazide sulfonylchloride or a mixture of an organic metal and an organic halogen-containing compound is a compound capable of generating or releasing an acid on irradiation of an active light, and can be used as the photolytically acid generating compound in the invention.

The organic halogen-containing compound known as an photoinitiator capable of forming a free radical is a compound capable of generating a hydrogen halide and can be used as the photolytically acid generating compound.

The examples of the organic halogen containing compound capable of forming a hydrogen halide include those disclosed in U.S. Pat. Nos. 3,515,552, 3,536,489 and 3,779,778 and West German Patent No. 2,243,621, and compounds generating an acid by photodegradation disclosed in West German Patent No. 2,610,842. As the photolytically acid generating compound, o-naphthoquinone diazide-4-sulfonylhalogenides disclosed in Japanese Patent O.P.I. Publication No. 50-30209 can be also used.

As the photolytically acid generating compound, a polyhalogenated compound may be especially preferable because the effect of the present invention becomes greater.

A polyhalogenated compound is a compound containing a trihalogenomethyl group, dihalogenomethyl group or a dihalogenomethylene group in the molecule. Preferable examples are halogenated compounds represented by the following Formula (1) and an oxadiazole compound with the above-described halogenated groups. Among these, a polyhaloacetyl compound represented by formula (2) is especially preferred.

$$R^1—CY_2—(C{=}O)—R^2 \qquad \text{Formula (1)}$$

wherein $R^1$ represents a hydrogen atom, a halogen atom, an alkyl group, an aryl group, an acyl group, an alkylsulfonyl group, an arylsulfonyl group, an iminosulfonyl group or a cyano group; R represents a monovalent substituent, provided that $R^1$ and $R^2$ may combine with each other to form a ring; and Y represents a halogen atom.

$$CY_3—(C{=}O)—X—R^3 \qquad \text{Formula (2)}$$

wherein $R^3$ represents a monovalent substituent; X represents —O— or —$NR^4$—, in which $R^4$ represents a hydrogen atom or an alkyl group, provided that $R^3$ and $R^4$ may combine with each other to form a ring; and Y represents a halogen atom. Among these, a compound having a polyhalogenated acetylamido group is preferably used. A compound having an oxadiazole ring with a polyhalogenated methyl group is also preferably used.

As a concrete structure represented by Formula (1), BR1 to BR70 described below may be listed. Further, a composition in which a polyhalogenated methyl group is substituted with an oxadiazole ring may be also preferably used. This example is listed in H-1 to H-14. Further, an oxadiazole disclosed in Japanese Patent O.P.I. Publication Nos. 5-34904, 5-45875, 8-240909 may be preferably used.

Incidentally, among these compounds, compunds whose halogen atom is replaced from bromine to chlorine can be also used conveniently in the present invention. The example of polyhalogenated compound preferably used for the present invention is listed to below.

BR1

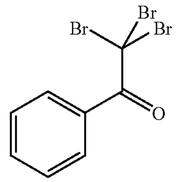

BR2

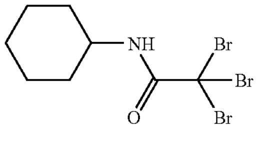

BR3

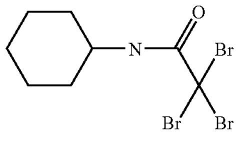

-continued
BR4
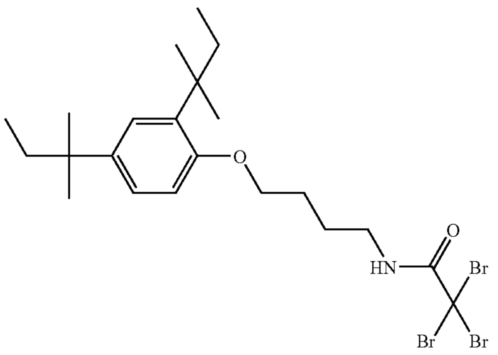
BR5
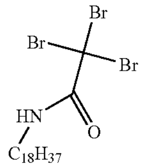
BR6
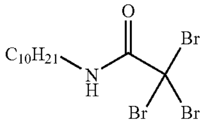
BR7
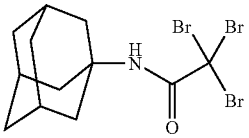
BR8
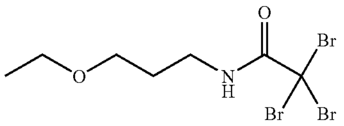
BR9
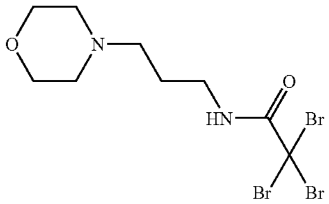
BR10
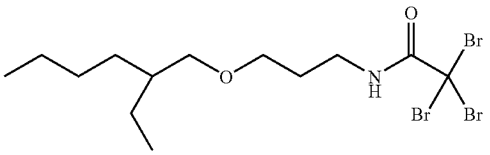

-continued
BR11
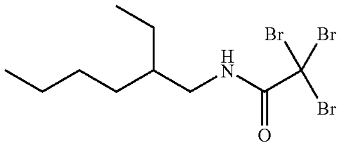
BR12
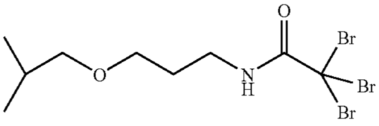
BR13
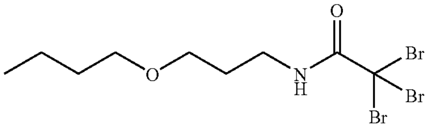
BR14
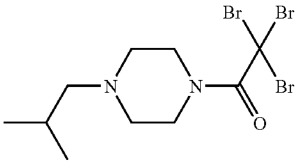
BR15
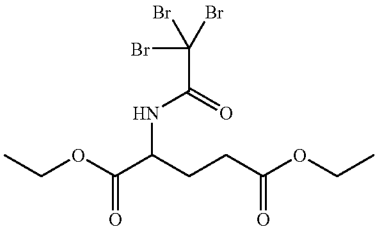
BR16
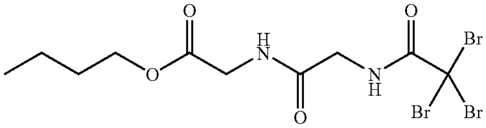
BR17
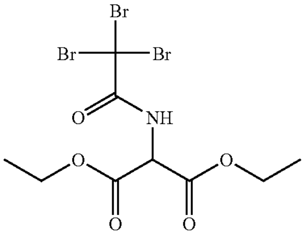
BR18
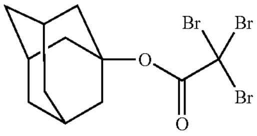

-continued
BR19
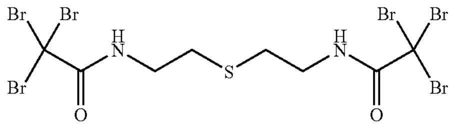
BR20
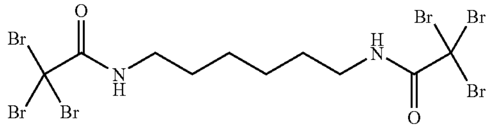
BR21
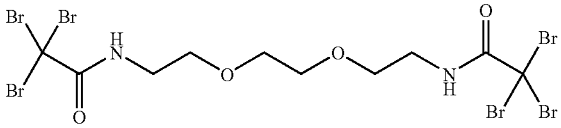
BR22
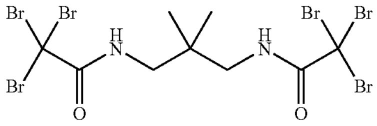
BR23
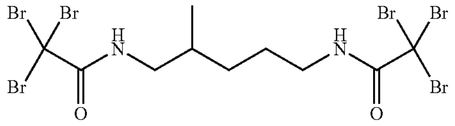
BR24
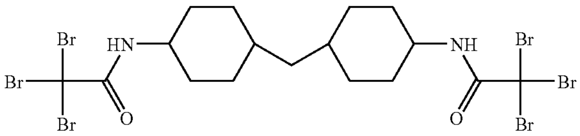
BR25
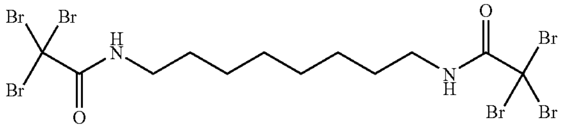
BR26
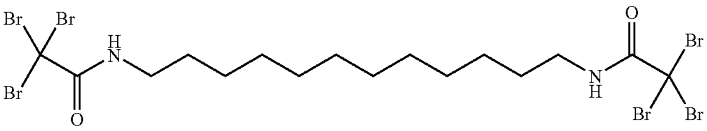
BR27
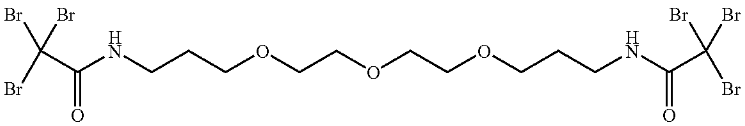
BR28
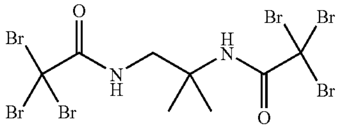

-continued
BR29
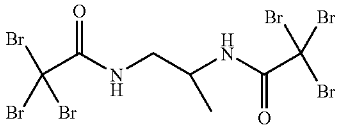
BR30
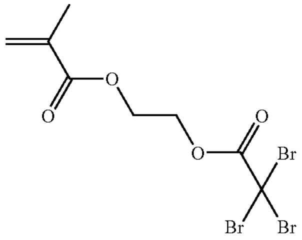
BR31
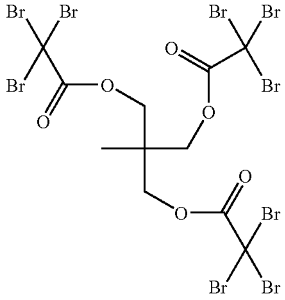
BR32
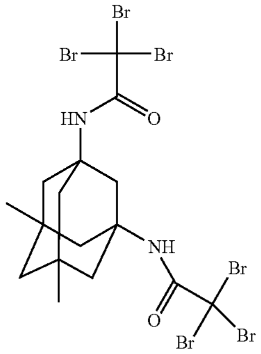
BR33
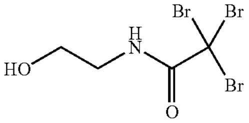
BR34
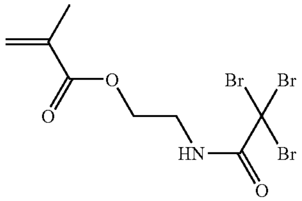

-continued
BR35
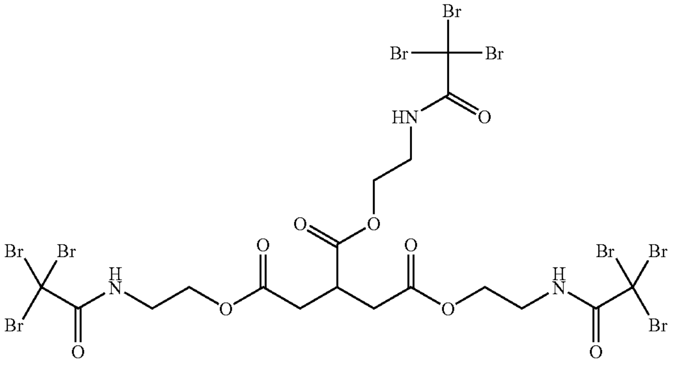
BR36
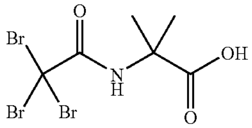
BR37
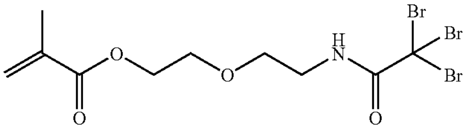
BR38
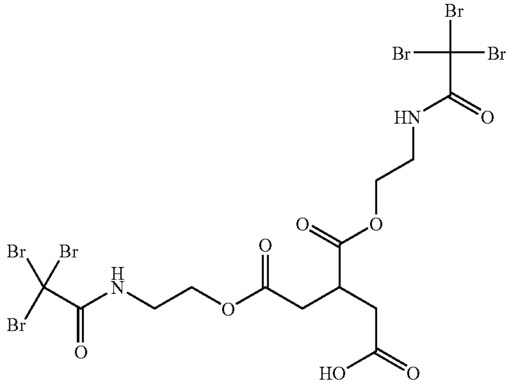
BR39
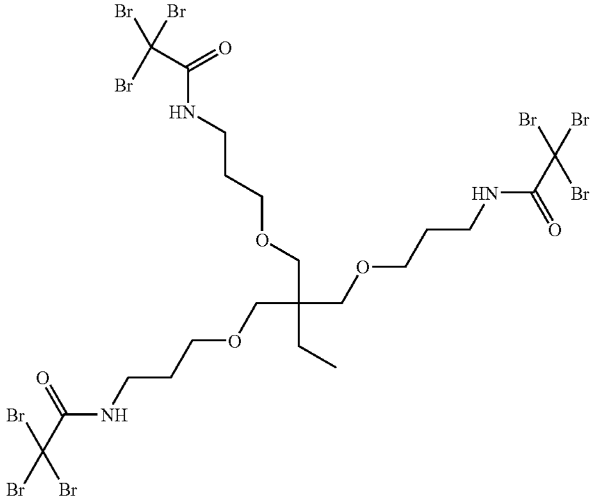

-continued
BR40
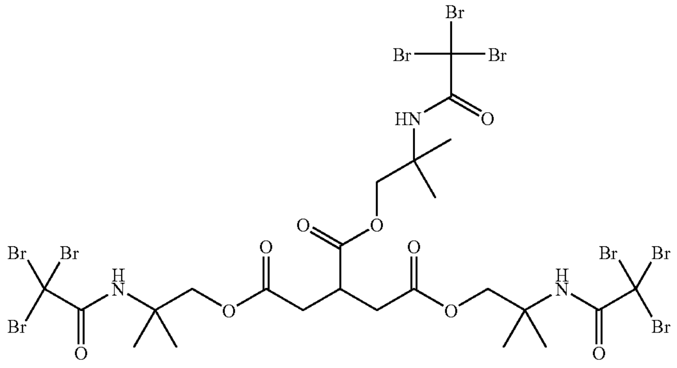
BR41
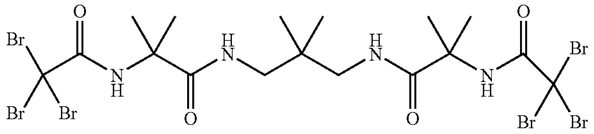
BR42
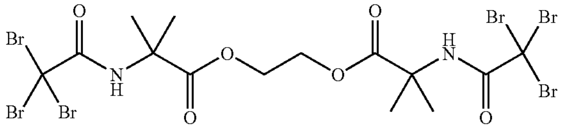
BR43
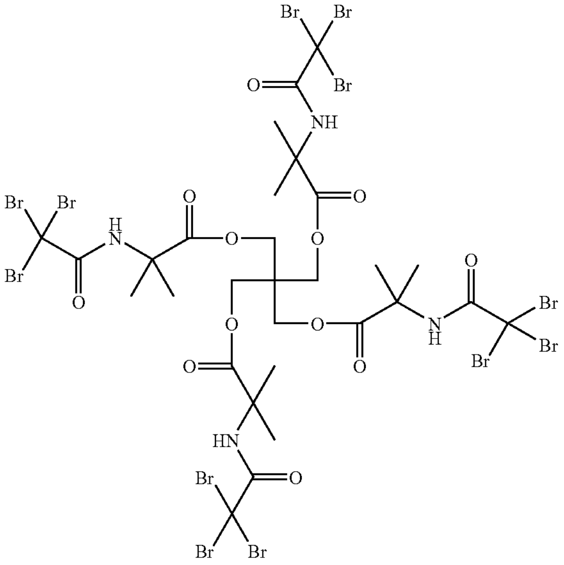

-continued
BR44
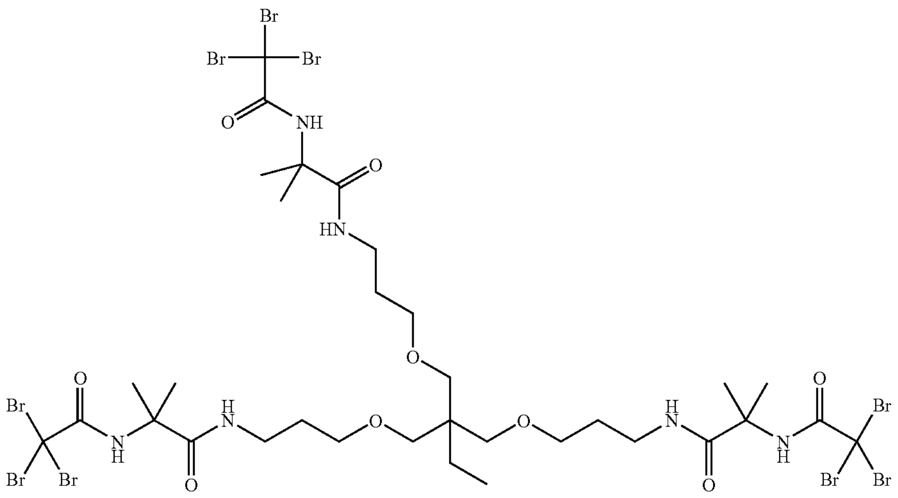
BR45
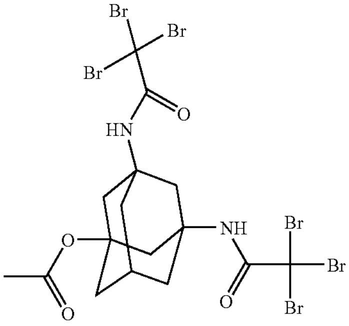
BR46
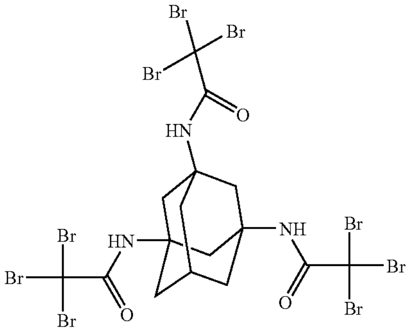
BR47
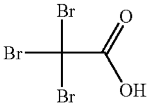
BR48
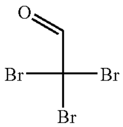

-continued
BR49
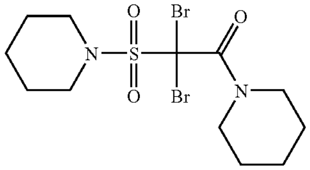
BR50
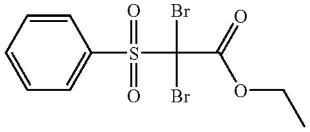
BR51
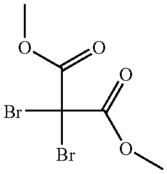
BR52
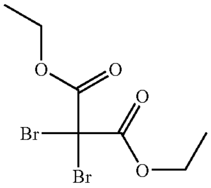
BR53
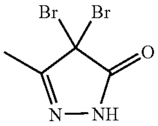
BR54
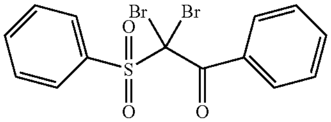
BR55
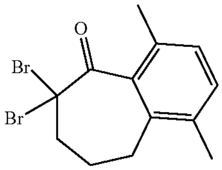
BR56
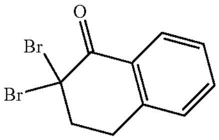

-continued
BR57
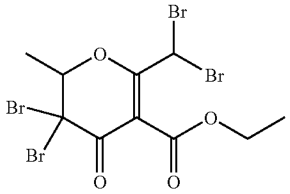
BR58
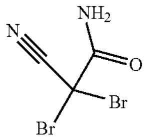
BR59
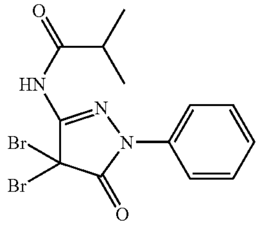
BR60
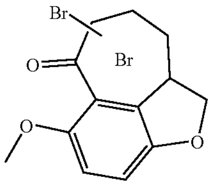
BR61
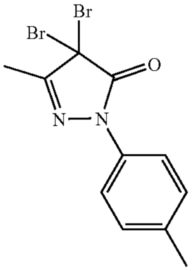
BR62
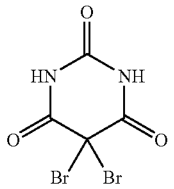
BR63
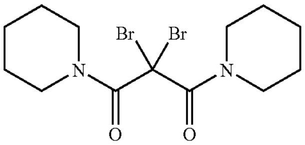

-continued
BR64
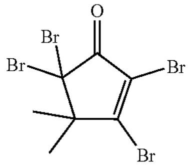
BR65
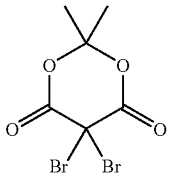
BR66
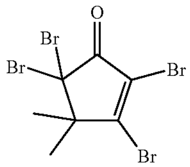
BR67
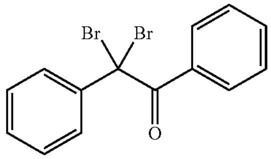
BR68
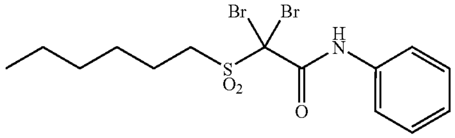
BR69
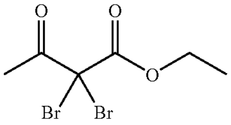
BR70
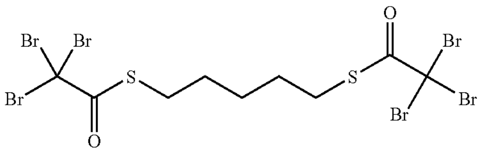
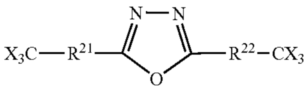
| No. | $R^{21}$ | $R^{22}$ | X |
|---|---|---|---|
| H-1 | Single bond | Single bond | Cl |
| H-2 | Single bond | Single bond | Br |
| H-3 | $CH_2$ | $CH_2$ | Cl |
| H-4 | $CH_2$ | $CH_2$ | Br |
| H-5 | $OCH_2$ | $OCH_2$ | Cl |

-continued

| | | | |
|---|---|---|---|
| H-6 | $OCH_2$ | $OCH_2$ | Br |
| H-7 | O | O | Cl |
| H-8 | O | O | Br |
| H-9 | OCO | COO | Cl |
| H-10 | $CH_2$—COO | COO—$CH_2$ | Br |
| H-11 | NH—CO | CO—NH | Cl |
| H-12 | NH—CO | CO—NH | Br |
| H-13 | $SO_2$—NH | NH—$SO_2$ | Cl |
| H-14 | $SO_2$—NH | NH—$SO_2$ | Br |

The content of the photolytically acid generating compound in the image formation layer is preferably 0.1 to 20% by weight, and more preferably 0.2 to 10% by weight based on the total weight of the solid components of the image formation layer, although the content broadly varies depending on its chemical properties, or kinds or physical properties of image formation layer used.

As the acid decomposable compound, there are a compound having a C—O—C bond disclosed in Japanese Patent O.P.I. Publication Nos. 48-89003, 51-120714, 53-133429, 55-12995, 55-126236 and 56-17345, a compound having an Si—O—C bond disclosed in Japanese Patent O.P.I. Publication Nos. 60-37549 and 60-121446, another acid decomposable compound disclosed in Japanese Patent O.P.I. Publication Nos. 60-3625 and 60-10247, a compound having an Si—N bond disclosed in Japanese Patent O.P.I. Publication No. 62-222246, a carbonic acid ester disclosed in Japanese Patent O.P.I. Publication No. 62-251743, an orthocarbonic acid ester disclosed in Japanese Patent O.P.I. Publication No. 62-209451, an orthotitanic acid ester disclosed in Japanese Patent O.P.I. Publication No. 62-280841, an orthosilicic acid ester disclosed in Japanese Patent O.P.I. Publication No. 62-280842, an acetal or ketal disclosed in Japanese Patent O.P.I. Publication No. 63-10153 and a compound having a C—S bond disclosed in Japanese Patent O.P.I. Publication No. 62-244038. Of these compounds, the compound having a C—O—C bond, the compound having an Si—O—C bond, the orthocarbonic acid ester, the acetal or ketal or the silylether disclosed in Japanese Patent O.P.I. Publication Nos. 53-133429, 56-17345, 60-121446, 60-37549, 60-251744 and 61-155481 are preferable.

The content of the acid decomposable compound in the image formation layer is preferably 5 to 70% by weight, and more preferably 10 to 50% by weight based on the total weight of the solid components of the image formation layer. The acid decomposable compounds may be used alone or as an admixture of two or more kinds thereof.

An above-mentioned positive type image forming layer may also contain a binder suitably if needed.

(B) used for a negative type image forming layer, for example, functions starting or progressing polymerization as described above so as to harden the exposed parts of an image forming layer, thereby acting not to remove the exposed parts of an image forming layer from the base support.

In this case, the negative type image forming layer may contain an unsaturated group containing compound which is polymerizable, and although (B) functions to start or promote polymerization of the unsaturated group containing compound which is polymerizable, (B) may also contain a polymerization initiator which generates a radical only with light and starts polymerization.

Although the followings are listed up as an example of the polymerization initiator containing (B) which generates a radical with these heat, it is desirable to use the polyhalogenated compound like the above described positive type.

Polymerization Initiator (b)

The photopolymerization initiator is a compound capable of initiating polymerization of an unsaturated monomer by laser. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563.

Typical examples of the photopolymerization initiator include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis(dimethylamino)benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85–277. (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

Furthermore, the following are cited as an example of a polymerization initiator.

Compounds which can generate a radical disclosed in JP-A 2002-537419; polymerization initiators disclosed in Japanese Patent O.P.I. Publication Nos. 2001-175006, 2002-278057, and 2003-5363; onium salts which have two or more cation sections in the molecule disclosed in Japanese Patent O.P.I. Publication No. 2003-76010, N-nitrosamine compounds disclosed in Japanese Patent O.P.I. Publication No. 2001-133966; compounds which generate a radical with heat disclosed in Japanese Patent O.P.I. Publication No. 2001-343742, compounds which generate an acid or a radical with heat disclosed in JP-A No. 2002-6482; borates described in JP-A No. 2002-116539; compounds which generate an acid or a radical with heat disclosed in Japanese Patent O.P.I. Publication No. 2002-148790; photolytic or thermal polymerization initiators which have an unsaturated group of the polymerizable disclosed in Japanese Patent O.P.I. Publication No. 2002-207293; onium salts which have an anion of divalence or more as a counter ion disclosed in Japanese Patent O.P.I. Publication No. 2002-268217; sulfonyl sulfone compounds having a specified structure disclosed in Japanese Patent O.P.I. Publication No. 2002-328465; and compounds which generate a radical with heat disclosed in Japanese Patent O.P.I. Publication No. 2002-341519.

The content of the polymerization initiator in the thermosensitive image formation layer is not specifically limited, but is preferably from 0.1 to 20% by weight, and more preferably from 0.8 to 15% by weight.

(Polymerizable Unsaturated Compound (c))

The polymerizable unsaturated compound is a compound having a polymerizable unsaturated group. Examples thereof include conventional radically polymerizable monomers, and polyfunctional monomers and polyfunctional oligomers each having plural ethylenically unsaturated bond ordinarily used in UV-curable resins.

The polymerizable unsaturated compound is not specifically limited, but preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexyl acrylate, or 1,3-dioxolanyl acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate, hydroxypivalylaldehyde modified dimethylolpropane triacrylate or EO-modified products thereof; and a methacrylate, itaconate, crotonate or maleate alternative of the above polyfunctional acrylate.

A prepolymer can be used as described above, and the prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethane-acrylate such as ethylene glycol-adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The image formation layer can contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

As a monomer used in combination in the image formation layer, there is a phosphate compound having at least one (meth)acryloyl group. The phosphate compound is a compound having a (meth)acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, a polymerizable unsaturated compound having a tertiary amino group in the molecule can be used preferably. The monomer is not specifically limited to the chemical structure, but is preferably a hydroxyl group-containing tertiary amine modified with glycidyl methacrylate, methacrylic acid chloride or acrylic acid chloride. Typically, a polymerizable compound is preferably used which is disclosed in Japanese Patent O.P.I. Publication Nos. 1-203413 and 1-197213.

In the invention, a reaction product of a tertiary amine having two or more hydroxyl groups in the molecule, a diisocyanate and a compound having a hydroxyl group and an addition polymerizable ethylenically double bond in the molecule is preferably used. A compound having a tertiary amino group and an amide bond in the molecule is especially preferred.

The tertiary amine having two or more hydroxyl groups in the molecule has a hydroxyl group of preferably from 2 to 6, and more preferably from 2 to 4. Examples of the tertiary amine having two or more hydroxyl groups in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N, N',N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto.

Examples of the compound having a hydroxyl group and an addition polymerizable ethylenically double bond in the molecule is not specifically limited, but 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate are preferred.

The reaction product can be synthesized according to the same method as a conventional method in which a urethaneacrylate compound is ordinarily synthesized employing a diol, a diisocyanate and an acrylate having a hydroxyl group.

Examples of the reaction product of a tertiary amine having two or more hydroxyl groups in the molecule, a diisocyanate having an aromatic ring in the molecule and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

M-6: A reaction product of triethanolamine (1 mole), 1,3-bis(1-isocyanato-1-methylethyl)benzene (3 moles), and 2-hydroxyethyl methacrylate (3 moles)

M-7: A reaction product of ethylenediamine tetraethanol (1 mole), 1,3-bis(1-isocyanato-1-methylethyl)benzene (4 moles), and 2-hydroxyethyl methacrylate (4 moles)

In addition to the above, acrylates or methacrylates disclosed in Japanese Patent O.P.I. Publication Nos. 2-105238 and 1-127404 can be used.

The polymerizable unsaturated compound content of the image formation layer is preferably from 5 to 80% by weight, and more preferably from 5 to 60% by weight.

The image formation layer in the invention comprising the polymerizable composition described above preferably contains an alkali soluble polymer.

The alkali soluble polymer is a polymer having a specific acid value, and as typical examples thereof, the following polymer having various structure can be preferably used.

Examples of the polymer include a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These polymers can be used as an admixture of two or more thereof.

For example, a polymer having a hydroxyl group or a carboxyl group is preferably used, and a polymer having a carboxyl group is more preferably used.

Among these is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl)methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenyl-methacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

An unsaturated bond-containing copolymer, which is obtained by reacting the polymer having a carboxyl group with for example, a compound having a (meth)acryloyl group and an epoxy group, is also preferred.

Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

Of the above alkali soluble polymers, those having an acid value of from 30 to 200 are preferred, and those having an acid value of from 50 to 150 are more preferred. Of these, those having a weight average molecular weight of from 15,000 to 500,000 are preferred, and those having a weight average molecular weight of from 20,000 to 100,000 are more preferred.

Of the above polymers, those having a polymerizable unsaturated group are preferred, and those having 5 to 50 mol % of the polymerizable unsaturated group as a repeating unit are especially preferred.

An alkali soluble polymer having a polymerizable unsaturated group can be synthesized according to a conventional method without any limitations.

For example, a method can be used which reacts a carboxyl group with a glycidyl group, or reacts a hydroxyl group with an isocyanate group.

(Another Polymer Binder)

The image formation layer in the invention can contain another polymer binder.

Examples of another polymer binder include a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These polymer binder can be used as an admixture of two or more thereof.

(Polymerization Inhibitor)

The image formation layer in the invention can optionally a polymerization inhibitor.

As the polymerization inhibitor, there is for example, a hindered amine with a base dissociation constant (pKb) of from 7 to 14 having a piperidine skeleton.

The polymerization inhibitor content is preferably from 0.001 to 10% by weight, more preferably from 0.01 to 10% by weight, and still more preferably from 0.1 to 5% by weight based on the total solid content of polymerizable unsaturated group-containing compound in the image formation layer.

The thermosensitive image formation layer in the invention may contain a second polymerization inhibiter other than the above-described polymerization inhibiter. Examples of the second polymerization inhibiter include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and 2-t-butyl-6-(3-t-butyl-6-hydroxy-5-methylbenzyl)-4-methylphenyl acrylate.

The thermosensitive image formation layer can contain a colorant. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". As the colorant, there are pigments.

As kinds of the pigments, there are black pigment, yellow pigment, red pigment, brown pigment, violet pigment, blue pigment, green pigment, fluorescent pigment, and metal powder pigment. Typical examples of the pigments include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigments, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of image formation layer.

In the invention, a protective layer is preferably provided on the image formation layer. It is preferred that the protective layer (oxygen shielding layer) is highly soluble in a developer as described later (generally an alkaline solution). The protective layer preferably contains polyvinyl alcohol and polyvinyl pyrrolidone. Polyvinyl alcohol has the effect of preventing oxygen from transmitting and polyvinyl pyrrolidone has the effect of increasing adhesion between the oxygen shielding layer and the image formation layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

(Support)

The support according to the present invention is a plate-like body or a film body capable of bearing the image forming layer, and preferably has a hydrophilic surface in a side in which the image forming layer is provided.

The support according to the present invention may include, for example, metal plates such as aluminum, stainless, chrome, nickel and other metals, or plastic films such as polyester film, polyethylene film, polypropylene film and other films which are laminated or vacuum evaporated with the metal thin films described above and the like.

Further, films such as polyester film, polyvinyl chloride film, and nylon film being subjected to the hydrophilic treatment on a surface thereof may be used, and of those the aluminum support is preferably used. In the case of the aluminum support, pure aluminum or aluminum base alloy is used.

As the aluminum base alloy for the support, various alloys may be used, including for example, alloys of aluminum and metals such as silicon, copper, manganese, magnesium, chrome, zinc, lead, bismuth, nickel, titanium, sodium, and iron. Further, the aluminum support used herein is that with a surface roughened so that a water holding capability is given.

Before surface roughing (graining treatment) is carried out, degreasing treatment is preferably carried out in order to remove the rolling-mill lubricant on the surface. As the degreasing treatment, a degreasing treatment using trichloro ethylene, thinner and the like, and an emulsion degreasing treatment using keshiron, triethanol and the like are used. Further, for the degreasing treatment, alkali aqueous solution such as caustic soda may be used. When the alkali aqueous solution such as caustic soda is used for the degreasing treatment, stains and oxide layers which can not be removed by only the above degreasing treatment can be removed. When the alkali aqueous solution such as caustic soda is used for the degreasing treatment, smuts are generated on the surface of the support, and in this case, desmutting treatment that dips the support into acid such as phosphoric acid, nitric acid, sulfuric acid, chromic acid, or mixed acid thereof is preferably carried out. The method of surface roughening may include, for example, a mechanical method and a method of etching by electrolysis.

Although the mechanical surface roughening method used herein is not specifically limited, brush polish method and honing polish method are preferred.

Although the electrochemical surface roughening method is also not specifically limited, a method of carrying out electrochemical surface roughening in an acid electrolyte is preferred.

After the surface is electrochemically roughened as described above, the support is preferably dipped into acid or alkali aqueous solution in order to remove aluminum waste and the like on the surface. As the acid, for example, sulfuric acid, persulfate, fluorinated acid, phosphoric acid, nitric acid, hydrochloric acid and the like are used, while as the base, for example, sodium hydrate, potassium hydrate and the like are used. Of those, the alkali aqueous solution is preferred for use. The dissolution volume of aluminum on the surface is preferably 0.5 through 5 $g/m^2$. After the soak treatment with the alkali aqueous solution, neutralization treatment is preferably carried out by dipping the support into acid such as phosphoric acid, nitric acid, sulfuric acid, chrome acid or mixed acid thereof.

The mechanical surface roughening method and the electrochemical surface roughening method may be independently used for surface roughening, or the surface roughening may be carried out by the mechanical surface roughening method followed by the electrochemical surface roughening method.

Next to the surface roughening treatment, anodic oxidation treatment may be carried out. The method of the anodic oxidation treatment applicable to the present invention is not specifically limited and known methods may be used. By carrying out the anodic oxidation treatment, an oxide layer is formed on the support.

The support having been subjected to the anodic oxidation treatment may be subjected to sealing treatment according to the necessity. The sealing treatment may be carried out using known methods such as hot water treatment, boiling water treatment, steam treatment, silicate soda treatment, dichromate salt solution treatment, nitrite salt treatment, ammonium acetate treatment and the like.

Further, after subjected to these treatments, the support which is undercoated with water-soluble resin, for example, polyvinyl phosphonic acid, polymer and copolymer having sulfonic acid group in the lateral chain, polyacrylic acid, water-soluble metallic salt (e.g. zinc borate) or yellow dye, amine salt and the like is preferred. Further, preferably used is a sol-gel treated substrate in which the functional group potentially inducing addition reaction by radicals as disclosed in Japanese Patent Publication Laid-Open No. Hei 05-304358 is covalently linked.

(Protective Layer)

A protective layer is preferably provided on the image formation layer in the invention.

It is preferred that the protective layer (oxygen shielding layer) is highly soluble in a developer (generally an alkaline solution).

Materials constituting the protective layer are preferably polyvinyl alcohol, polysaccharide, polyvinyl pyrrolidone, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide. These materials may be used alone or in combination. Especially preferred material is polyvinyl alcohol.

A coating liquid for the protective layer is obtained by dissolving the materials described above in a solvent. The coating liquid is coated on the light sensitive layer and dried to form a protective layer. The dry thickness of the protective layer is preferably from 0.1 to 5.0 μm, and more preferably from 0.5 to 3.0 μm. The protective layer may contain a surfactant or a matting agent.

The same coating method as described above in the image formation layer applies in the protective layer coating method. The drying temperature of the protective layer is preferably lower than that of the image formation layer. The former is preferably not less than 10° C. lower than that of the latter, and more preferably not less than 20° C. lower than that of the latter.

Further, the drying temperature of the protective layer is preferably lower than a glass transition temperature (Tg) of the binder contained in the image formation layer. The drying temperature of the protective layer is preferably not less than 20° C. lower than Tg of the binder contained in the image formation layer, and more preferably not less than 40° C. lower than Tg of the binder contained in the image formation layer. The drying temperature of the protective layer is preferably at most 60° C. lower than Tg of the binder contained in the image formation layer.

In the coating process for a light-sensitive planographic printing board used for the present invention, each compositions and various additives of the above mentioned image forming layer are dissolved in a suitable solvent, and are coated to base support.

As far as a solvent has has sufficient solubility to each above-mentioned compositions and provides an excellent characteristic of a coating layer, the kind of the solvent is not restricted.

As such a solvent, for example, cellosolve-based solvents, such as methyl cellosolve, ethyl cellosolve, methyl cellosolve acetate and ethyl cellosolve acetate, propylene glycol-based solvents, such as dipropylene glycol dimethyl ether, propylene glycol methyl ether, propylene glycol mono-ethyl ether, propylene glycol mono-butyl ether, a propylene-glycol-methyl-ether acetate, propylene glycol mono-ethyl ether acetate, a propylene glycol mono-butyl ether acetate, ester-based solvents, such as butyl acetate, amyl acetate, ethyl butylate, benzyl butyrate, a diethyl oxalate, pyruvic acid ethyl and ethyl-2-hydroxy butyrate, an ethylacetoacetate, methyl lactate, ethyl lactate, and 3-methoxy methyl propionate, alcoholic-based solvents, such as heptanol, hexanol, diacetone alcohol, and furfuryl alcohol, ketone-based solvents, such as cyclohexanone and methyl amyl ketone, high polar solvents, such as dimethylformamide, N,N-dimethylacetamide, and N-methylpyrolidone, in addition, acetic acid, these mixed solvents, and mixed solvent in which aromatic hydrocarbon is added, may be listedded.

The using rate of a solvent is usually within a range of one to 20 (mass ratio) times to the total amount of light-sensitive compositions.

The coating process is carried out by known methods such as, for example, roll-on coating, wire-bar coating, dip coating, air-knife coating, roll coating, blade coating, and curtain coating.

The coating quantity for the dry film thickness is generally in the range of 0.3 through 7 μm, preferably 0.5 through 5 μm, and more preferably 1 through 3 μm.

Next, in the dry process after coating, drying is generally carried out at 30 through 170° C., preferably in the range of 40 through 150° C. to reduce the proportion of the residual solvent in the image forming layer to generally 10% by mass or less.

After the dry process, an aging process is carried out according to the necessity. The aging process is to keep printing plates under heating under certain conditions, and through the aging process, the development latitude can be widened.

Before or after the aging process, there is a cutting process for cutting out the light sensitive planographic printing plate into a given size.

The cutting process is to cut out the light sensitive planographic printing plate into a given size depending on the various applications.

Incidentally, even after this cutting process, a process for removing a portion of the light sensitive planographic printing plate for the purpose of the final fitting size after through other processes or end treatment may be included.

Next, the inspection/sorting process is to judge whether the light sensitive planographic printing plate as a final product has commercial value as a product.

Light sensitive planographic printing plates judged to have no commercial value in the inspection/sorting process are recycled or discarded and not shipped. The inspection/sorting process is carried out through worker's eyes, computer processing of information obtained from a camera, or using the above two together. In the inspection/sorting process, blemishes and coating irregularities on the surface of the image forming layer are inspected.

Although the inspection/sorting process is necessary in the final sorting as a product, depending on the case, a process for inspecting and sorting surface defects and the like may be provided between the processes before the cutting process.

Light sensitive planographic printing plates judged to be shipped as products through the inspection/sorting process are set to the configuration for shipping.

Depending on the types of the light sensitive planographic printing plates, a plurality of light sensitive planographic printing plates is mounted on a horizontal or vertical mount base. In this case, the products are provided to a user in the state of being mounted on the base, and are set as the mount base for light sensitive planographic printing plates of a photolithography machine.

Further, when the light sensitive planographic printing plates are mounted on the mount base for light sensitive planographic printing plates of the photolithography machine in the user's side, the supplier packs the products using a packing outer case such as cardboard for transporting to the user (packaging process). The light sensitive planographic printing plates mounted on the mount base or packed are shipped and finally supplied to the user.

Next, the processes for plate making and printing using the light sensitive planographic printing plate include the exposure process, developing process, and printing process.

(Plate Making Method)

The light sensitive planographic printing plate according to the present invention is exposed by a laser beam with an emission wavelength in the wavelength range of 700 nm through 1200 nm.

As the laser source of the laser beam with an emission wavelength in the wavelength range of 700 nm through 1200 nm, YAG laser, semiconductor laser and the like are preferably used.

In the case of the laser exposure, scan exposure depending on the image data is possible by narrowing the light in the beam-shape, the exposure area is easily narrowed to a minute size, and high resolution image formation may be realized.

As the laser scanning method, there are cylinder outer surface scanning, cylinder inner surface scanning, planner scanning and the like. In the cylinder outer surface scanning, the laser exposure is carried out rolling a drum with a recording material wound around the periphery thereof, wherein the rotation of the drum is assumed to be main scanning and the movement of the laser light is assumed to be sub scanning. In the cylinder inner surface scanning, the recording material is fixed on the inner surface of the drum and the laser beam is irradiated from the inside, wherein the main scanning is carried out in the circumference direction by rotating a portion or the whole of the optical system, while the sub scanning is carried out in the axial direction by moving a portion or the whole of the optical system parallel to the drum shaft. In the planner scanning, the main scanning of the laser light is carried out by combining a polygon mirror or a galvanometer mirror with an fθ lens and the like, while the sub scanning is carried out by the movement of the recording medium. The cylinder outer surface scanning and cylinder inner surface scanning are easily increase the accuracy of the optical system as compared to the other scanning method, thereby being suitable for the high density recording.

(Automatic Developing Equipment)

In the using method of the present invention, the effect of the present invention is effective in a method of subjecting the light sensitive planographic printing plate material to the developing treatment using automatic developing equipment, which is a preferred embodiment.

The automatic developing equipment is preferably added with a mechanism for automatically replenishing a required amount of replenishment solution to a developing bath, preferably added with a mechanism for discharging the developing solution exceeding a certain amount, preferably added with a mechanism for automatically replenishing a required amount of water to the developing bath, preferably added with a mechanism for detecting passing-through, preferably added with a mechanism for estimating a processed area of a plate based on the detection of passing-through, preferably added with a mechanism for controlling a replenishment amount and/or replenishment timing of replenishment solution and/or water to be replenished based on the detection of passing-through and/or the estimation of the processed area, preferably added with a mechanism for controlling a temperature of the developing solution, preferably added with a mechanism for detecting pH and/or conductivity of the developing solution, and preferably added with a mechanism for controlling the replenishment amount and/or replenishment timing of the replenishment solution and/or water to be replenished based on the pH and/or conductivity of the developing solution.

The automatic developing equipment may have a preparation section for causing the plate to dip into a preparation solution before the developing process. This preparation section is preferably added with a mechanism for spraying a preparation solution onto a plate face, preferably added with a mechanism for controlling a temperature of the preparation solution at any temperature of 25° C. through 55° C., and preferably added with a mechanism for rubbing the plate face with a roller-like brush. Further, water or the like is used as the preparation solution.

(After Treatments)

The plate having been subjected to the developing treatment is after treated with work water, rinse agent containing surface active agent, a finisher or protective gum mainly composed of Arabian gum, starch derivative and the like, and then is applied to printing.

These after treatments are carried out using the automatic developing equipment generally comprising a developing section and an after treatment section.

The after treatment solution is used in the method that sprays from a spray nozzle, or in the method that dips and feeds the plate in the treatment bath filled with the treatment solution. Also known is a method that supplies a given amount of a little work water to the plate face to rinse it in water, reusing the waste solution as dilution water for the developing solution. Such an automatic treatment can be carried out while replenishing each of the replenishment solutions to each of the treatment solutions depending on the treatment quantity and operation time and the like. Also, the so-called disposable processing system of treating with practically unused after treatment solution may be applicable. The light sensitive planographic printing plate obtained through such processes is applied to the offset printing machine and is used for printing multiple sheets.

In the case of the light sensitive planographic printing plate material having a protective layer, the plate making method including a process of treating the material with work water before developing is the preferred embodiment.

(Printing)

The light sensitive planographic printing plate material is applied to printing after having been subjected to the plate making and after treatment.

The printing may be carried out using a common lithography machine.

Before the exposure process, the provided light sensitive planographic printing plate is mounted on a mount base for light sensitive planographic printing plates of the exposure equipment, and when the light sensitive planographic printing plate is packed, the packing box is opened to take out the light sensitive planographic printing plate to mount it on the mount base.

The processes may be consistently automated until the printed matter is created, in which the printing plate is fed by an automatic feeding machine from the exposure equipment to the developing equipment and to the printing machine, or each of the processes may be independent in which the worker transports the printing plate to the next process. Even not only the case in which the worker directly handles the printing plate, but also the case in which the transportation is automated, in the case where the worker confirms or operates the instruments involved in the exposure equipment, developing equipment, and printing machine and when the workspaces around each of the processes are under the light-emitting diode light, the workability is higher as compared to that under the red color and the like.

EXAMPLES

Next, the present invention will be explained employing examples, but the present invention is not limited thereto. In the examples, “parts” represents “parts by weight”, unless otherwise specified.

Example 1

<<Polymer Binder: Synthesis of Acryl Copolymer 1>>

Thirty parts of methacrylic acid, 50 parts of methyl methacrylate, 20 parts of ethyl methacrylate, 250 parts of isopropyl alcohol, 250 parts of propylene glycol monomethyl ether acetate, and 3 parts of α,α'-azobisisobutyronitrile were placed in a three neck flask under nitrogen atmosphere, reacted under nitrogen atmosphere for 6 hours at 80° C. in an oil bath.

Then, it was refluxed at a boiling point of isopropyl alcohol for one hour. After that, 3 parts of triethylbenzylammonium chloride and 25 parts of glycidyl methacrylate were further added to the reaction mixture, and reacted for 3 hours. Thus, acryl copolymer 1 was obtained.

The weight average molecular weight of acryl copolymer 1 was 35,000 (in terms of polystyrene), measured according to GPC, and the glass transition point (Tg) of acryl copolymer 1 was 85° C., measured according to DSC (differential scanning calorimetry)

[Production of Base Support]

The following process was conducted continuously, using a JISA1050 aluminum plate with a thickness of 0.30 mm and a width of 1030 mm.

(a) An etching process was performed to the aluminum plate by a spray at a caustic soda concentration of 2.6 weight %, an alminum ion concentration of 6.5 weight %, and the temperature of 70° C., and whereby the aluminum plate was dissolved by 0.3 g/m$^2$. Thereafter, Washing by a spray was performed.

(b) A desmatt process was conducted by a spray with an aqueous solution (containing alminum ion of 0.5 weight %) having a nitric acid concentration of 1 weight % at a temperature of 30° C., and thereafter it was washed by a spray.

(c) An electrolytically surface-roughening process was continuously performed using an AC voltage of 60 Hz.

An electrolytic solution contained alminum ion 0.5 weight % and acetic acid 0.007 weight %.

The temperatur was 21° C. A surface roughening process was conducted electrochemically with a paired poles of carbon electrodes by the use of a sine wave alternating current having a time TP of 2 msec until an electric current value reaches a peak from zero as for an alternating-current power supply.

A current density was 50 A/dm$^2$ as effective value, and an energizing amount was 900 C/dm$^2$. Subsequently, washing was performed by a spray.

(d) A desmut process was conducted by a spray with an aqueous solution (containing 0.5 weight % of alminum ion) having a phosphoric acid concentration of 20 weight % at a temperature of 60° C., and thereafter it was washed by a spray.

(e) Anodic treatment was performed with an electrolysis section (containing 0.5 weight % of alminum ion) having a sulfuric acid concentration of 170 g/liter at a temperature of 38° C. by the use of an anodic-oxidation apparatus (the first and second electrolysis section length each of 6 m, the first electric supply section length of 3 m, the second electric supply section length of 3 m, the first and second electric supply electrode length each of 2.4 m).

Thereafter, washing was performed by a spray. At this time, in the anodic-oxidation apparatus, an electric current from the power supply flows into the first electric supply electrode provided in the first electric supply section, flows into a plate-shaped alminum through an electrolyte, produces an oxide film on the surface of the plate-shaped aluminum in the first electrolysis section, passes along an electrolysis electrode provided in the first electric supply section, and returns to the power supply.

On the other hand, Although an electric current from the power supply flows into the second electric supply electrode provided in the second electric supply section, similarly flows into a plate-shaped alminum through an electrolyte and produces an oxide film on the surface of the plate-shaped alminum in the second electrolysis section, an electrical quantity which the power supply supplied to the first electric supply section was the same as the electrical quantity which the power supply supplied to the second electric supply section, and the electric supply current densities in the oxide film surface in the second electric supply section was about 25 A/dm$^2$. In the second electric supply section, an electric power was supplied from the oxide film surface of 1.35 g m$^2$. The final amount of oxide films was 2.7 g/m$^2$.

Furthermore, after spray washing, it was immersed for 30 seconds into the polyvinyl phosphonic acid solution of 0.4 weight % s (PVPA30 by Clariant Co., Ltd. was diluted and used), and thereby hydrophilization treatment was carried out. Temperature was 85° C. Subsequently, spray washing was carried out and it was dried with an infrared heater.

At this time, a center line average roughness (Ra) of the surface was 0.55 micrometers.

(Production of a Light Sensitive Planographic Printing Plate)

On the above-mentioned base support, the photopolymerizable image forming layer coating liquid of the following compositions was coated with a wire bar so that it became 1.5 g/m$^2$ at the time of a dried state, and it was dried for 1.5 minutes at 95° C., and the photopolymerizable image forming layer coating sample was obtained.

Furthermore, on the photopolymerizable image forming layer coating sample, an oxygen barrier coating liquid of the following compositions was coated with a wire bar so that it became 1.8 g/m$^2$ at the time of a dried state, and it was dried for 1.5 minutes at 75° C., and thereby a light sensitive planographic printing plate sample which has an oxygen barrier on an image forming layer was produced.

As a safelight, a fluorescent lamp manufactured by FLR40S-/M-XNational was used with EncapSuliteR-10 filter and the sample was produced under an illuminance of 30 lux.

After the sample was produced, works were conducted under light emission source shown in Table. An illuminance was 300 lux.

An illuminance was measured by the use of a digital illuminometer T-1M (made by the Konica Minolta Camera sensing company).

| (Image forming layer coating liquid) | |
|---|---|
| Ethylenically unsaturated bond containing monomer (B-1) | 27.0 parts |
| Ethylenically unsaturated bond containing monomer (NK ester 4G: made by Shin-Nakamura Chemical Co., Ltd.) | 14.0 parts |
| Dye (D-1) | 3 parts |

-continued

| | |
|---|---|
| Photopolymerization initiator (Fe-1) | 4.0 parts |
| Polyhalogenated compound (BR22) | 4.0 parts |
| Acrylics base copolymer 1 | 41.0 parts |
| Phthalocyanine pigment (MHI454: made by Mikunisikiso company) | 6.0 parts |
| 2-t-butyl-6-(3-t-butyl-2-hydroxy-5-methyl benzyl)-4-methylphenyl acrylate (Sumi Reiser GS: manufactured by Sumitomo 3 M Company) | 0.5 parts |
| Fluorine base surfactant (FC-4430; manufactured by Sumitomo 3 M company) | 0.5 parts |
| Methyl ethyl ketone | 80 parts |
| Cyclohexanone | 820 parts |
| (Oxygen barrier coating liquid) | |
| PVAL (GL-05: made by a Japanese synthetic chemistry company) | 89 parts |
| Polyvinyl pyrrolidone (PVP K-30: made in Polygonum tinctorium SP Japan) | 10 parts |
| Surfactant (Sirphinol 465: made by Nissin Chemical Industry Co., Ltd.) | 0.5 parts |
| Water | 900 parts |

B-1

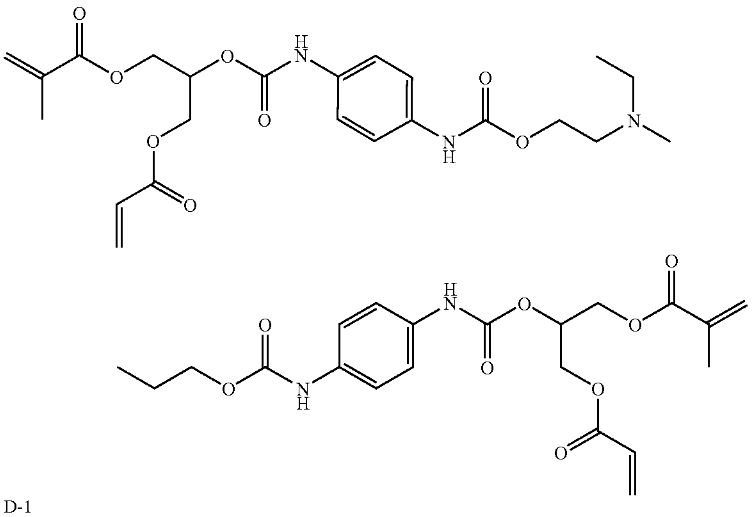

D-1

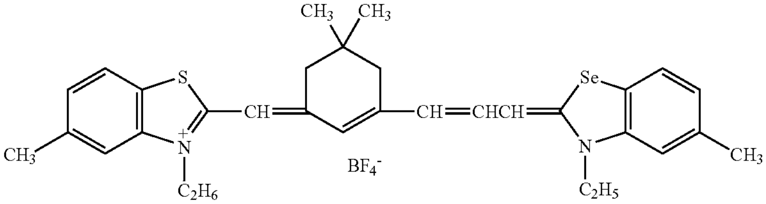

Fe-1
Fe-2 (η6-cumene) (η5-cyclopenladienyl iron (2) hexafluorophosphate
BR22

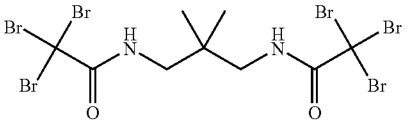

<Light Exposure and Developing>

The obtained light sensitive planographic printing plate sample was exposed on a condition that a plate surface energy was 150 mJ/cm$^2$ and on a condition of 2400 dpi (dpi shows a resolution per 1 inch, i.e., the dot number per 2.54 cm) with Trendsetter3244VFs made by Creo company in which a water cooling type 40W infrared semiconductor laser was mounted.

After light exposure, a power supply of a heat source of a preheating section was set to OFF so as to allow a light sensitive planographic printing plate only to pass without preheating. Developing was performed by CPT automatic processor (PHW23-V: made by Technigraph Co., Ltd.) equipped with a preliminary rinse section which removes an oxygen barrier before developing, a developing section filled up with a developer solution of the following compositions, a washing section which removes the developer solution adhering to a printing plate surface, and a gum liquid process section (GW-3: a two time-diluted solution produced by Mitsubishi Chemical Co., Ltd.) for protecting a line-drawing part, and whereby a planographic printing plate was obtained.

| (Developer solution D-1 composition) | |
|---|---|
| A sodium silicate | 8.0 parts |
| Newcol B-13SN (produced by Nippon Nyukazai Co., Ltd.) | 2.0 parts |
| Pronon #204 (made by Nippon Oil & Fats Co., Ltd.) | 1.0 parts |
| Ethylenediaminetetraacetic acid 2 sodium 2 hydration salt | 0.1 parts |
| Potassium hydroxide | an added amount to make pH = 12.9 |

<Printing>

On a printing apparatus (DAIYA1 F-1: manufactured by Mitsubishi Heavy Industries Co., Ltd.), the produced planographic printing plate was used for printing with the use of a coated paper, a printing ink (Toyoking high echo M red: produced by Oriental ink company), and a dampening solution (SG-51, H solution produced by Tokyo Ink Co., Ltd., Concentration: 1.5%), and each of following characteristics were evaluated.

<<Evaluation of Dot Reproducibility (Linearity)>>

By 2400 dpi (dpi expresses the dot number per 2.54 cm), a halftone dot image of 175 lines was dividedly drawn for every 5% from 0% to 100% without no correction for the linearity.

When exposing with an exposure amount with which a halftone dot to be 10% became 12% by changing the exposure amount, a dot to be 50% was measured and the measurement value-50% was indicated as a linearity in Table, and then this was used as an index of the evaluation of dot reproducibility.

In the measurement, the halftone dot output image was photographed with a 500 time optical microscope, the area of an imaging area was calculated so as to make a halftone %. Since it is so preferable that it is close to 50%, in Table, the measurement result near zero is preferable.

<<Dirt Recoverability>>

The printing plate was wiped with the cleaner after 1,000-sheet continuation printing, printing was resumed 15 minutes afterward, and the dirt recoverability was evaluated by the number of sheets whose dirt on the background of no line drawing portion was not observed. It was so excellent that it was few.

<<Dot Quality>>

Dot neighboring 50% was observed with a 100 time magnifying glass and evaluated with one of five steps. "5": no fringe was observed and it was a very smooth dot quality, "4": although a fringe was observed occasionally, it was a smooth dot quality, "3": fringes were often observed, but it was a practically satisfactory dot quality, "2": fringes were conspicuous and may pose a problem practically, and "1": fringes were many and dot was irregular and was practically problem. The results are shown in Tables 6 and 7.

TABLE 1

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 15 | 12 | 5 | Inv. |
| E1L55-AW-b5 (by Toyoda) | 15 | 12 | 5 | Inv. |
| NSPW-500BS-b2S (by Nichia) | 15 | 13 | 5 | Inv. |
| NSPW-500BS-dS (by Nichia) | 14 | 14 | 5 | Inv. |
| NSPW-500S-fS (by Nichia) | 15 | 13 | 5 | Inv. |
| FLR110H-W/A (by Matushita) | 20 | 25 | 3 | Comp. |

by Toyoda: produced by Toyoda Gosei Co., LTD.
by Nichia: produced by Nichia Chemical Co., LTD.
by Matushita: produced by Matushita Electric Industrial Co., LTD From Table 1, it can be seen that according to the using method of the present invention, a printing plate which was excellent in dot reproducibility and dirt recoverability was obtained and further a printing matter which was excellent in dot quality was obtained.

Example 2

Example 2 was performed similarly to Example 1 except that production of a light sensitive planographic printing plate and the developer solution were conducted by the following contents.

<<Production of Support>>

After anodic oxidation, in place of the process with polyvinyl phosphonic acid in the production of the support production of Example 1, a boiling water sealing hole process was performed with a 30-degree C. hot water for 20 seconds, and thereby an aluminum plate was produced as a support of a light sensitive planographic printing plate.

<<A Synthesis of an Acid Decomposable Compound>>

1,1-dimethoxy cyclohexane (0.5 mols), phenyl Cellosolve (1.0 mols), and 80 mg of p-toluenesulfonic acid were reacted at 100° C. for 1 hour, while being agitated, after that, the temperature was gradually raised to 150° C., and further it was further made to react at 150° C. for 4 hours. During this period, methanol produced by this reaction was extracted in the meantime.

After cooling, 500 ml of tetrahydrofuran and 2.5 g of carbon dioxide potassium were added into the reacted compositions, and the compositions were agitated and filtered. A solvent was extracted under a reduced pressure from a filtrate, low-boiling compositions were extracted under 150° C. and a high vacuum, and thereby the following viscous and oily acid decomposable compound A was obtained.

Acid decomposition compound A

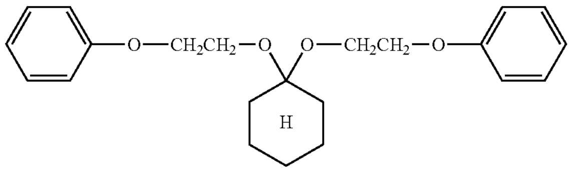

An image forming layer coating solution of the following compositions was coated on a support of the above-mentioned aluminum plate with a rotatable coating apparatus such that a layer thickness after drying became 2 g/$m^2$, then it was dried for 2 minutes at 100° C., whereby the light sensitive planographic printing plate was obtained.

| Composition of an image forming layer coating solution | |
|---|---|
| Binder A | 60 parts |
| Acid decomposable compound | 20 parts |
| Polyhalogenated compound (2-trichloromethyl-5-[beta-(2-benz frill) vinyl]-1,3,4-oxydiazole) | 5 parts |
| Infrared absorption dye (IR17) | 2 parts |
| Propylene glycolmono-methyl ether | 1000 parts |
| Developer solution: SDR-1 (manufactured by Konica Corp.) was diluted to 6 times in volume ratio with water. | |

Binder A

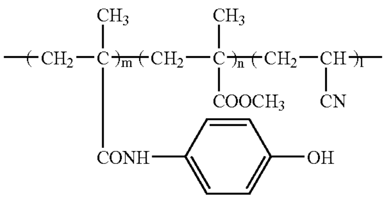

(Mw = 22000 Mw/Mn = 1.5
m:n:I = 30:40:30)

IR17

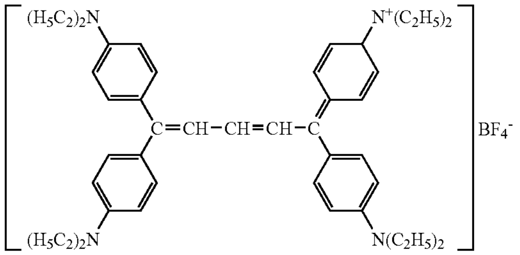

The results are shown in Tables 6 and 7.

TABLE 2

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 14 | 13 | 5 | Inv. |
| E1L55-AW-b5 (by Toyoda) | 14 | 13 | 5 | Inv. |
| NSPW-500BS-b2S (by Nichia) | 14 | 13 | 5 | Inv. |
| NSPW-500BS-dS (by Nichia) | 14 | 14 | 5 | Inv. |
| NSPW-500S-fS (by Nichia) | 15 | 15 | 5 | Inv. |
| FLR110H-W/A (by Matushita) | 19 | 25 | 3 | Comp. |

From Table 2, it can be seen that according to the using method of the present invention, a printing plate which was excellent in dot reproducibility and dirt recoverability was obtained and further a printing matter which was excellent in dot quality was obtained.

Example 3

Example 3 was performed similarly to Example 1 except that production of a light sensitive planographic printing plate and the developer solution were conducted by the following contents.

After anodic oxidation, in place of the process with polyvinyl phosphonic acid in the production of the support production of Example 1, a process with an aqueous solution containing 2.5 weight % of sodium silicatean was performed at 30-degree C. for 10 seconds, and thereby an aluminum plate was produced as a support of a light sensitive planographic printing plate.

The following base coat liquid was coated on a support of the above-mentioned aluminum plate, coating was dried for 15 seconds at 80° C., and the support was obtained. The amount of covering of the coating after a dry process was 15 mg/$m^2$.

| (Base coat liquid) | |
|---|---|
| The following compound | 0.3 parts |
| Methanol | 100 parts |
| Water | 1 part |

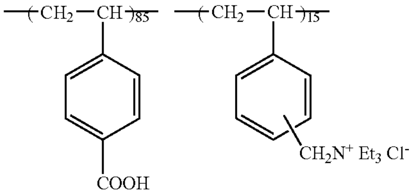

Molecular weight 28 thousand

<Production of Support 1>

The following backcoat coating solution-1 was coated onto the reverse side of the support processed as mentioned above by a bar coater so that the coated amount after a dry process became 30 mg/$m^2$, and by drying it for 1 minute at 100° C., the backcoat layer was provided on it and thereby Support 1 was produced.

| (Backcoat coating solution-1) a sol - gel reaction liquid: | |
|---|---|
| Tetra-ethyl silicate | 50 parts |
| Water | 86.4 parts |
| Methanol | 10.8 parts |
| Phosphoric acid (85%) | 0.08 parts |

When the above-mentioned compositions were mixed and stirred, the compositions generated heat in about 35 minutes.

After the compositions were stirred for 40 minutes so as to react, the compositions was further mixed with the following diluted solution, and thereby a backcoat coating solution-1 was prepared.

| Diluted solution: | |
|---|---|
| Pyrogallol-acetone condensation resin | 3.5 parts |
| Dibutyl maleate | 5.0 parts |
| MEGAFAC F-177 (fluorochemical surfactant manufactured by Dainippon Ink & Chemicals, Inc.) | 0.8 parts |
| Methanol | 800 parts |
| Propylene glycol methyl ether | 270 parts |

[Coating an Image Forming Layer]

After coating the following coating solutions for a lower image forming layer onto the above-mentioned Support 1 so that a coated amount became 0.75 g/m$^2$, it was dried for 50 seconds at 140° C. by setting WindControl at 7 with PERFECT OVENPH200 manufactured by TABAI Co., Ltd., and after that, after a coating solution for an upper image forming layers was coated such that a coated amount became 0.3 g/m$^2$ about it dried for 1 minute at 120° C., and thereby a light sensitive planographic printing plate was obtained.

| [The coating solution for a lower image forming layer] | |
|---|---|
| N-(4-amino sulfonyl phenyl) methacrylamide/ acrylonirile/methyl methacrylate (molar ratio 36/34/30, weight average molecular weight 50000) | 2.133 parts |
| 3-methoxy-4-diazophenylaminehexafluorophosphate | 0.030 parts |
| Cyanine dye A (the following structure) | 0.109 parts |
| 4 and 4'-bishydroxyphenyl sulfone | 0.063 parts |
| Anhydrous tetra-hydronalium phthalic acid | 0.190 parts |
| P-toluenesulfonic acid | 0.008 parts |
| A composition that a paired ion of ethyl violet was changed into 6-hydroxy naphthalene sulfonic acid | 0.05 parts |
| Fluoro base surfactant (MEGAFAC F176 made by Dainippon Ink Industrial company) | 0.035 parts |
| Methylethylketone | 26.6 parts |
| 1-Methoxy-2-propanol | 13.6 parts |
| Gamma-butyrolactone | 13.8 parts |

Cyanine dye A

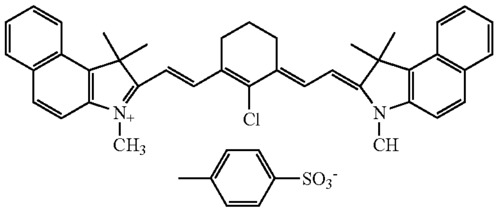

| [The coating solution for an upper image forming layer] | |
|---|---|
| m, p-cresol novolak (m/p ratio = 6/4, a weight average molecular weight 4500, unreacted cresol 0.8 weight % content) | 0.237 parts |
| Cyanine dye A (the above-mentioned structure) | 0.047 parts |
| Stearic acid dodecyl | 0.060 parts |
| 3-methoxy-4-diazodiphenylaminehexafluorophosphate | 0.030 parts |
| Fluoro base surfactant (MEGAFAC F176, manufactured by Dainippon Ink & Chemicals, Inc.) | 0.110 parts |
| Fluoro base surfactant (MEGAFAC MCF312 (30%), Dainippon Ink Industrial company make) | 0.120 parts |
| Methyl ethyl ketone | 15.1 parts |
| 1-Methoxy-2-propanol | 10.0 parts |

[A prepress operation and printing]

An image drawing with a halftone dot was conducted for the light sensitive planographic printing plate 1 of the present invention produced as mentioned above was performed by Trendsetter manufactured by Creo Co., Ltd. with light exposure energy (140 mJ/cm$^2$), the dot of 175 lines and 2400 dpi (dpi expresses the dot number per 2.54 cm).

Next, a developing process was conducted for the planographic printing plate on which an imagewise exposure was performed, by the use of a developer solution DT-1 and a developing booster DT-1R manufactured by Fuji Photo Film Co., Ltd.

The results are shown in Tables 6 and 7.

TABLE 3

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 19 | 17 | 4 | Inv. |
| E1L55-AW-b5 (by Toyoda) | 19 | 17 | 4 | Inv. |
| NSPW-500BS-b2S (by Nichia) | 19 | 18 | 4 | Inv. |
| NSPW-500BS-dS (by Nichia) | 18 | 17 | 4 | Inv. |
| NSPW-500S-fS (by Nichia) | 18 | 18 | 4 | Inv. |
| FLR110H-W/A (by Matushita) | 22 | 26 | 3 | Comp. |

From Table 3, it can be seen that according to the using method of the present invention, a printing plate which was excellent in dot reproducibility and dirt recoverability was obtained and further a printing matter which was excellent in dot quality was obtained.

Example 4

Example 4 was performed similarly to Example 1 except that production of a light sensitive planographic printing plate and the developer solution were conducted by the following contents.

The following photosensitive solution was coated with a wire bar on an aluminum plate produced similarly to Example 1 and was dried for 2 minutes at 85° C., and whereby a light sensitive planographic printing plate having a layer thickness of 20 mg/dm$^2$ was obtained.

| (Photosensitive solution) | |
|---|---|
| M-cresol/p-cresol/phenolic novolac (SK-188, product made by Sumitomo Dules Co., Ltd.) | 0.5 parts |
| SIMEL 300 (a methoxy methyl melamine base, conversion rate to methoxy: 90% or more, produced by Mitsui Cyanamid Co., Ltd.) | 0.1 parts |
| Infrared absorption dyestuff CY-10 (made by NIPPON KAYAKU CO., LTD) | 0.025 parts |
| 2,4,6-Tris (tri chloromethyl)-s-triazine | 0.015 parts |
| Cyclohexanone | 5.7 parts |
| 2-mercapt benz thiazole | 0.024 parts |

This light sensitive planographic printing plate was attached on the rotating drum, and a scanning exposure was performed under yellow light on it with a laser light (40 mW) which was generated such that a semiconductor laser (830 nm, made by Appliedtechno company) was shaped with a lens to a beam diameter of 25-micrometer.

Subsequently, after-heating were performed for 3 minutes at 100° C., and developing was performed at 25° C. and for 30 seconds with a solution in which a developer solution SDR-1 (for a positive type planographic printing plate, manufactured by Konica Corp.) was diluted to 6 times.

The results are shown in Tables 6 and 7.

TABLE 4

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 17 | 12 | 5 | Inv. |
| E1L55-AW-b5 (by Toyoda) | 17 | 12 | 5 | Inv. |
| NSPW-500BS-b2S (by Nichia) | 16 | 11 | 5 | Inv. |
| NSPW-500BS-dS (by Nichia) | 16 | 10 | 5 | Inv. |
| NSPW-500S-fS (by Nichia) | 16 | 12 | 5 | Inv. |
| FLR110H-W/A (by Matushita) | 22 | 22 | 3 | Comp. |

From Table 4, it can be seen that according to the using method of the present invention, a printing plate which was excellent in dot reproducibility and dirt recoverability was obtained and further a printing matter which was excellent in dot quality was obtained.

Example 5

Example 5 was performed similarly to Example 1 except that production of a light sensitive planographic printing plate and the developer solution were conducted by the following contents.

After anodic oxidation, in place of the process with polyvinyl phosphonic acid in the production of the support production of Example 1, a process with an aqueous solution containing 2.5 weight % of sodium silicatean was performed at 30-degree C. for 10 seconds, and thereby an aluminum plate was produced as a support of a light sensitive planographic printing plate.

[Formation of an Intermediate Layer]

A liquefied composition (sol liquid) was adjusted by the following procedure.

| (Sol liquid composition) | |
|---|---|
| Methanol | 130 parts |
| Water | 20 parts |
| 85 weight % phosphoric acid | 16 parts |
| Tetraethoxysilane | 50 parts |
| 3-methacryloxypropyltrimethoxysilane | 60 parts |

The above-mentioned compounds were mixed and agitated.

Generation of heat was observed in about 5 minutes. After making them react for 60 minutes, the resultant composition content were shifted to another container and was added with 3000 g of methanol, whereby a sol liquid was obtained.

This sol liquid was diluted with methanol/ethylene glycol=9/1(mass ratio), and were coated on the above-mentioned support so that the quantity of Si on the support became 3 mg/$m^2$, and it was made to dry for 1 minute at 100° C., and whereby a base board was obtained.

[Formation of an Image Forming Layer]

An image forming layer coating solution of the following composition was coated to a surface of the base board produced as mentioned above, and dried at 115° C. for 1 minute, whereby an image forming layer of 1.4 g/$m^2$ was formed and a light sensitive planographic printing plate was obtained.

| (Image forming layer coating solution) | |
|---|---|
| Additionally-polymerizable compound (pentaerythritol tetra-acrylate) | 1.5 parts |
| Binder (allyl methacrylate/methacrylic acid copolymer (copolymerization molar ratio: 83/17) acid number 1.55 m Eq)/g, polymerization average molecular weight 125,000) | 2.0 parts |
| Light-to-heat converting agent (DX-1) | 0.1 parts |
| Polymerization initiator (S-33) | 0.15 parts |
| Fluorine base nonion surfactant (MEGAFAC F-177P manufactured by Dainippon Ink & Chemicals, Inc.) | 0.02 parts |
| Dye in which a paired anion of Victoria pure blue BOH was to 1-naphthalenesulfonic acid anion | 0.04 parts |
| Methyl ethyl ketone | 10 parts |
| Methanol | 7 parts |
| 2-methoxy-1-propanol | 10 parts |

DX-1

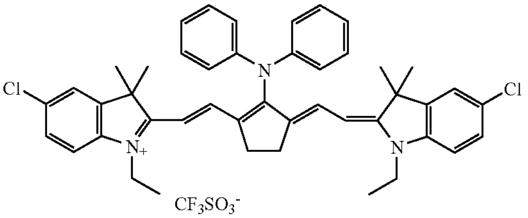

(S-33)

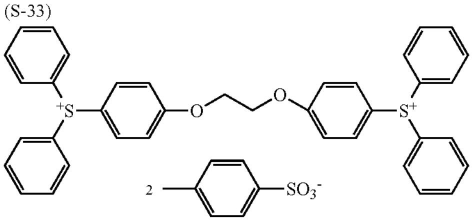

[Light Exposure, Developing]

After exposing the obtained light sensitive planographic printing plate with a semiconductor laser having an output of 500 mW, a wavelength of 830 nm, and a beam diameter of 17 micrometers (l/e2) at a main scanning speed of 5 m/second, the plate was developed by the use of an automatic processor (PS processor 900VR manufactured by Fuji Photo Film Co., Ltd.) with D-1 developer solution of the following composition and a rinse agent FR-3 (1:7).

| (D-1 developer solution) | |
|---|---|
| Potassium hydroxide | 3 parts |
| Sodium hydrogencarbonate | 1 part |
| Potassium carbonate | 2 parts |
| Sodium sulfite | 1 part |
| Polyethylene glycol mono-naphthylether | 150 parts |
| Dibutyl sodium naphthalenesulfonate salt | 50 parts |
| Ethylenediamine-tetra-acetic-acid 4 sodium salt | 8 parts |
| Water | 785 parts |

The results are shown in Tables 6 and 7.

With regard to a working efficiency after producing the light sensitive planographic printing plates in Examples 1–5, a plate inspection work for all the plates could be carried out easily in a short time as compared with the case under a conventional fluorescent lamp of white light, and other works could be carried out almost equivalent to the case under the fluorescent lamp of white light.

TABLE 5

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 17 | 17 | 4 | Inv. |
| E1L55-AW-b5 (by Toyoda) | 16 | 17 | 4 | Inv. |
| NSPW-500BS-b2S (by Nichia) | 17 | 16 | 4 | Inv. |
| NSPW-500BS-dS (by Nichia) | 16 | 17 | 4 | Inv. |
| NSPW-500S-fS (by Nichia) | 15 | 17 | 4 | Inv. |
| FLR110H-W/A (by Matushita) | 20 | 25 | 3 | Comp. |

From Table 5, it can be seen that according to the using method of the present invention, a printing plate which was excellent in dot reproducibility and dirt recoverability was obtained and further a printing matter which was excellent in dot quality was obtained.

Example 6

Example 6 was performed similarly to Example 1 except that production of a light sensitive planographic printing plate and the following plate producing works were conducted under light emitting sources shown in Table 6, and an illuminance was 100 lux.

The results are shown in Tables 6 and 7.

With regard to working efficiencies of producing works for light sensitive planographic printing plates and subsequent plate producing works, a plate inspection work for all the plates could be carried out easily in a short time as compared with the case under a conventional fluorescent lamp of white light, and other works could be carried out almost equivalent to the case under the fluorescent lamp of white light.

TABLE 6

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 15 | 10 | 5 | Inv. |
| E1L55-AW-b5 (by Toyoda) | 14 | 11 | 5 | Inv. |
| NSPW-500BS-b2S (by Nichia) | 13 | 10 | 5 | Inv. |
| NSPW-500BS-dS (by Nichia) | 13 | 11 | 5 | Inv. |
| NSPW-500S-fS (by Nichia) | 14 | 10 | 5 | Inv. |
| FLR110H-W/A (by Matushita) | 24 | 24 | 3 | Comp. |

From Table 6, it can be seen that according to the using method of the present invention, a printing plate which was excellent in dot reproducibility and dirt recoverability was obtained and further a printing matter which was excellent in dot quality was obtained

Example 7

Example 6 was performed similarly to Example 2 except that production of a light sensitive planographic printing plate was conducted under light emitting sources shown in Table 7, and an illuminance was 100 lux(es).

After light exposure, EncapSuliteR-10 filter was used for a fluorescent lamp of a safelight FLR40S-/M-X manufactured by National Co., Ltd. and works were conducted under an illuminance of 100 lux.

The results are shown in Tables 6 and 7.

With regard to working efficiencies of producing works for light sensitive planographic printing plates, a plate inspection work for all the plates could be carried out easily in a short time as compared with the case under a conventional fluorescent lamp of white light, and other works could be carried out almost equivalent to the case under the fluorescent lamp of white light.

TABLE 7

| Light source (Comparative fluorescent lamp) | Dirt Recoverability sheets | Linearity % | Dot Quality Ranks | Remarks |
|---|---|---|---|---|
| E1L53-AW-a0 (by Toyoda) | 15 | 14 | 5 | Inv. |
| E1L55-AW-b5 (by Toyoda) | 14 | 15 | 5 | Inv. |
| NSPW-500BS-b2S (by Nichia) | 15 | 14 | 5 | Inv. |
| NSPW-500BS-dS (by Nichia) | 14 | 15 | 5 | Inv. |
| NSPW-500S-fS (by Nichia) | 15 | 14 | 5 | Inv. |
| FLR110H-W/A (by Matushita) | 20 | 26 | 3 | Comp. |

From Table 7, it can be seen that according to the using method of the present invention, a printing plate which was excellent in dot reproducibility and dirt recoverability was obtained and further a printing matter which was excellent in dot quality was obtained.

What is claimed is:

1. A method of manufacturing a light sensitive planographic printing plate which has an image forming layer containing (A) a coloring material having an absorption in a wavelength range of 700 nm through 1200 nm and (B) a radical, generator on a support and is exposed by a laser beam with a light emission wavelength in a wavelength range of 700 nm through 1200 nm, the method comprising:

at least coating process, dry process, cutting process, and inspection/sorting process, wherein at least one of the coating process, the dry process, the cutting process, or the inspection/sorting process is carried out under light of a light source comprising a light-emitting diode (LED) with an emission wavelength maximum in a range of 400 nm through 500 nm and a fluorescent phosphor to emit an yellow light by absorbing a light emission of the light-emitting diode.

2. The method of claim 1, wherein an illuminance of the light source is 10 lx to 5000 lx.

3. The method of claim 2, wherein an illuminance of the light source is 30 lx to 1000 lx.

4. The method of claim 1, wherein an illuminance of the light source is 100 lx to 500 lx.

5. The method of claim 1, wherein the emission wavelength of the light source exists in an entire visible range.

6. The method of claim 1, wherein the light source emits a pseudo white light by synthesis of a violet-blue light emitted from LED and an yellow light emitted from the fluorescent phosphor.

7. The method of claim 1, wherein the LED includes zinc selenide or nitrogen gallium.

8. The method of claim 1, wherein the fluorescent phosphor is a YAF:Ce phosphor or a sialon phosphor.

9. The method of claim 1, wherein the fluorescent phosphor is a combination of a red fluorescent phosphor and a green fluorescent phosphor.

10. The method of claim 9, wherein $Y_2O_2S$:Eu, $Y_2O_3$:Eu, or (Y, Gd) $BO_3$:Eu is used as the red fluorescent phosphor, and ZnS:Cu, Al, $LaPO_4$:Ce, Tb, $Zn_2SiO_4$:Mn, or $Gd_2O_2S$:Tb is used as the green fluorescent phosphor.

11. The method of claim 1, wherein the light source is located at 0.5 m to 10 mm distant from the light sensitive planographic printing plate.

12. The method of claim 1, wherein the radical generator is a polyhalogenated compound.

13. A method of using a light sensitive planographic printing plate which has an image forming layer containing (A) a coloring material having an absorption in a wavelength range of 700 nm through 1200 nm and (B) a radical generator on a support and is exposed by a laser beam with a light emission wavelength in a wavelength range of 700 nm through 1200 nm, the method comprising:

at least exposing process, developing process, and printing process, wherein at least one of the exposing process, the developing process, and the printing process is carried out under light of a light source comprising a light-emitting diode (LED) with an emission wavelength maximum in a range of 400 nm through 500 nm and a fluorescent phosphor to emit an yellow light by absorbing a light emission of the light-emitting diode.

* * * * *